United States Patent
Nakamura et al.

(10) Patent No.: US 9,659,746 B2
(45) Date of Patent: May 23, 2017

(54) ADJUSTMENT METHOD FOR CHARGED PARTICLE BEAM DRAWING APPARATUS AND CHARGED PARTICLE BEAM DRAWING METHOD

(71) Applicant: NuFlare Technology, Inc., Yokohama-shi (JP)

(72) Inventors: Takashi Nakamura, Yokohama (JP); Rieko Nishimura, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/188,007

(22) Filed: Jun. 21, 2016

(65) Prior Publication Data

US 2017/0011884 A1  Jan. 12, 2017

(30) Foreign Application Priority Data

Jul. 9, 2015  (JP) ................................ 2015-137940

(51) Int. Cl.
- *H01J 37/20* (2006.01)
- *G21K 5/04* (2006.01)
- *H01J 37/30* (2006.01)
- *H01J 37/317* (2006.01)

(52) U.S. Cl.
CPC .......... *H01J 37/3005* (2013.01); *H01J 37/20* (2013.01); *H01J 37/3174* (2013.01); *H01J 2237/31725* (2013.01)

(58) Field of Classification Search
USPC ... 250/492.1, 492.2, 492.21, 492.22, 492.23, 250/492.3
See application file for complete search history.

(56) References Cited

U.S. PATENT DOCUMENTS

| 2003/0038250 A1* | 2/2003 | Komuro | B82Y 10/00 250/492.2 |
|---|---|---|---|
| 2003/0152850 A1* | 8/2003 | Kamijo | G03F 1/20 430/30 |
| 2007/0158576 A1* | 7/2007 | Kamikubo | B82Y 10/00 250/398 |

FOREIGN PATENT DOCUMENTS

| JP | 7-50248 | 2/1995 |
| JP | 9-63933 | 3/1997 |
| JP | 9-186070 | 7/1997 |
| JP | 2010-245099 | 10/2010 |

* cited by examiner

*Primary Examiner* — Nicole Ippolito
(74) *Attorney, Agent, or Firm* — Oblon, McClelland, Maier & Neustadt, L.L.P.

(57) ABSTRACT

According to one embodiment, a method of adjusting a charged particle beam drawing apparatus includes obtaining an offset amount in beam size to be set in the charged particle beam drawing apparatus. The method includes forming a linear evaluation pattern on a substrate by changing number of divisions of a beam with a predetermined size and performing drawing by using divided beams, obtaining a change amount in a line width of the evaluation pattern from a design dimension for each number of divisions, and calculating the offset amount by fitting a model function to the change amount for each number of divisions, the model function being obtained by modeling a pattern line width based on a distribution of energy given by charged particle beams.

9 Claims, 5 Drawing Sheets

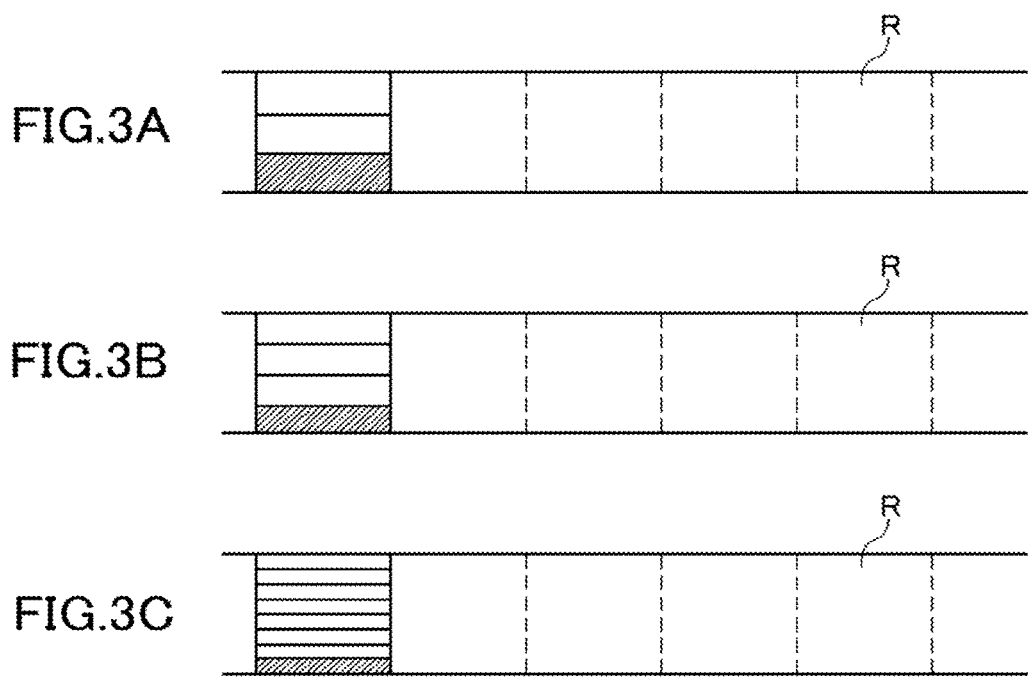
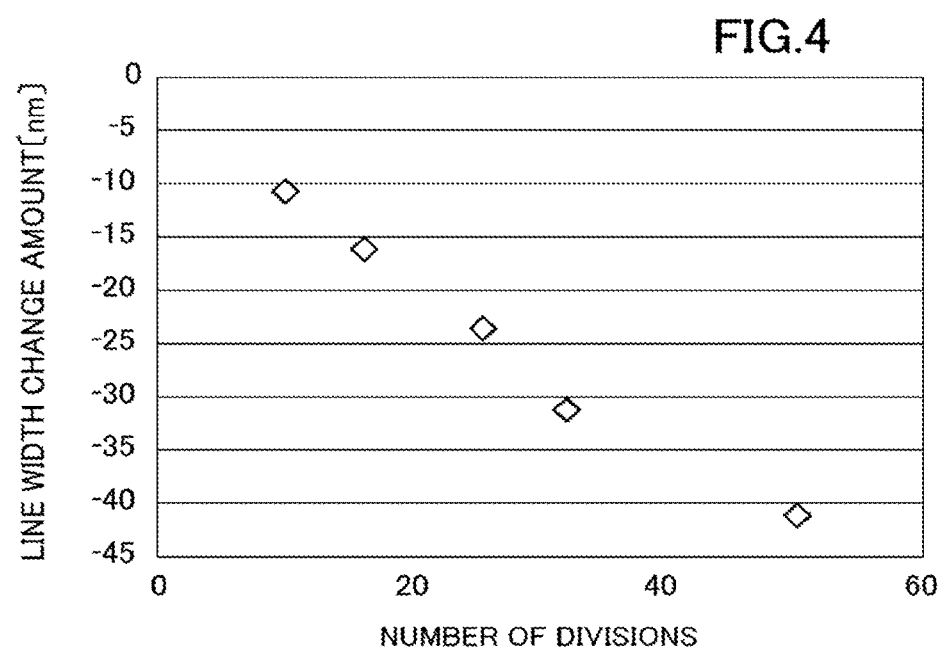

ADJUSTMENT METHOD FOR CHARGED PARTICLE BEAM DRAWING APPARATUS AND CHARGED PARTICLE BEAM DRAWING METHOD

CROSS REFERENCE TO RELATED APPLICATION

This application is based upon and claims benefit of priority from the Japanese Patent Application No. 2015-137940, filed on Jul. 9, 2015, the entire contents of which are incorporated herein by reference.

FIELD

The present invention relates to an adjustment method for charged particle beam drawing apparatus and a charged particle beam drawing method.

BACKGROUND

Along with high integration in LSIs, circuit line widths in semiconductor devices are becoming increasingly fine year by year. To form a desired circuit pattern on a semiconductor device, a method is used in which a high-precision original drawing pattern (also referred to as a mask or as a reticle particularly when the original drawing pattern is used by a stepper or scanner) formed on quartz is reduced and transferred to a wafer by using a reduction projection exposure apparatus. A high-precision original design pattern is drawn by an electronic beam drawing apparatus and a so-called electronic beam lithography technology is used.

One method in electronic beam lithography is a VSB method in which variable shaped beams are used. In this method, a graphic pattern is drawn on a specimen placed on a movable stage by using, for example, electron beams that have been formed in an arbitrary shape by being passed through an opening with a first forming aperture and an opening with a second forming aperture.

In this VSB method, a pattern is formed by linking beams formed so as to have various sizes and shapes. To draw a high-precision pattern on a specimen, it is necessary to adjust an offset, which is the amount of difference in beam size, to an optimum value and set the value in the drawing apparatus.

In a conventional method of obtaining an optimum offset amount, a line pattern formed by linking divided rectangular beams with the same width is first drawn by changing the number of divisions and the offset amount to form an evaluation pattern. Next, for each offset amount, the degree (inclination) of a change in the line width of the evaluation pattern is obtained with respect to the number of divisions. Then, the offset amount at which the inclination becomes zero is obtained from each offset amount and the inclination of the change in the line width of the evaluation pattern, and this offset amount has been calculated as an optimum offset amount at which the line width does not change depending on the number of divisions.

However, the line width change amount and the number of divisions have a non-linear relationship, so there was a difference between the offset amount that was obtained by the method described above and the actual optimum offset amount. Therefore, it has been not possible to set an optimum offset amount in a drawing apparatus and it has been difficult to improve drawing precision.

Furthermore, in the conventional method described above, the evaluation pattern needs to be drawn by changing the number of divisions and the offset amount, so obtaining the optimum offset amount has taken time.

BRIEF DESCRIPTION OF THE DRAWINGS

FIGS. 3A to 3C are drawings illustrating an example of a method of drawing an evaluation pattern.

FIG. 4 is a graph illustrating an example of the amount of line width change from a design value for each number of divisions.

DETAILED DESCRIPTION

According to one embodiment, a method of adjusting a charged particle beam drawing apparatus includes obtaining an offset amount in beam size to be set in the charged particle beam drawing apparatus. The method includes forming a linear evaluation pattern on a substrate by changing number of divisions of a beam with a predetermined size and performing drawing by using divided beams, obtaining a change amount in a line width of the evaluation pattern from a design dimension for each number of divisions, and calculating the offset amount by fitting a model function to the change amount for each number of divisions, the model function being obtained by modeling a pattern line width based on a distribution of energy given by charged particle beams.

An embodiment of the present invention will be hereinafter explained with reference to drawings.

Figure 1:
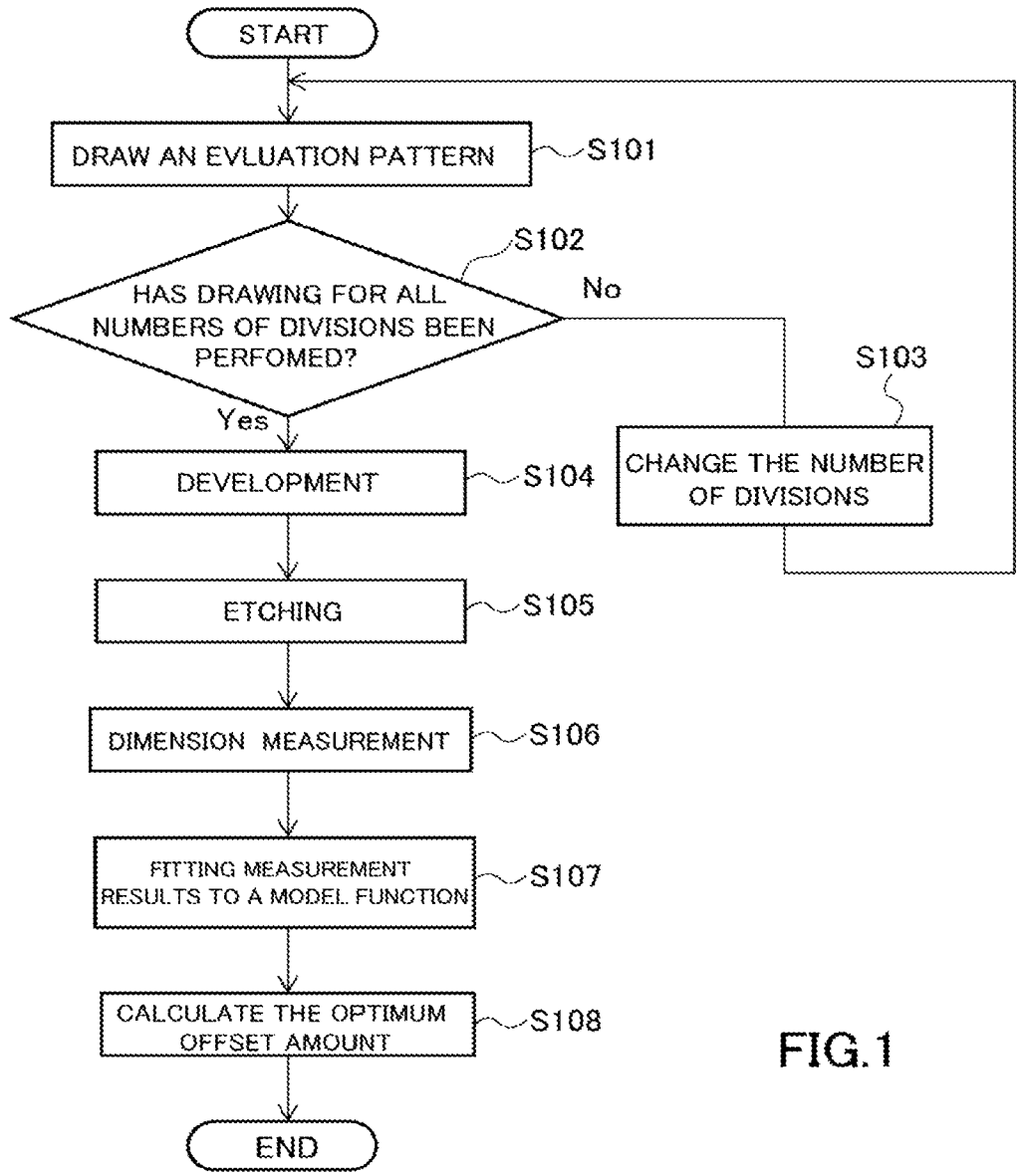
FIG. 1 is a flowchart illustrating a method, in this embodiment, of adjusting a drawing apparatus.

The offset amount, which is the amount of difference in beam size, is set in an electron beam drawing apparatus at an adjustment step. The beam size is corrected by using this amount of offset and then drawing is performed. FIG. 1 is a flowchart illustrating a method of adjusting an electron beam drawing apparatus; by the method, the optimum amount of offset to be set in the drawing apparatus is obtained.

As illustrated in FIG. 1, this method includes a process (steps S101 to S103) in which an evaluation pattern is drawn on a resist film on a substrate by varying a beam size, a process (step S104) in which development processing is performed to form a resist pattern, a process (step S105) in which etching processing is performed by using the resist pattern as a mask to form an evaluation pattern in a light-shielding film, a process (step S106) in which the line width of the evaluation pattern is measured, a fitting process using a model function (step S107), and a process (step S108) in which the optimum offset amount is calculated.

Figure 2:
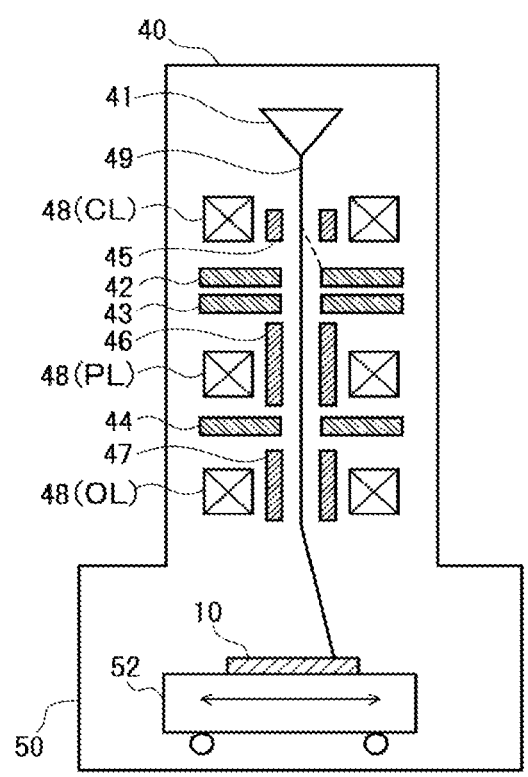
FIG. 2 is a schematic drawing of an electronic beam drawing apparatus.

FIG. 2 is a schematic drawing of an electronic beam drawing apparatus that performs evaluation pattern drawing. The electronic beam drawing apparatus has an electron beam column 40 and a drawing chamber 50. In the electron beam column 40, an electron gun 41, a blanking aperture 42, a first aperture 43, a second aperture 44, a blanking deflector 45, a shaping deflector 46, an objective deflector 47, and lenses 48 (condenser lens CL, projection lens PL, and objective lens OL) are placed.

In the drawing chamber 50, an XY stage 52 placed so as to be movable is disposed. On the XY stage 52, a mask substrate 10 for use in evaluation is mounted. The mask substrate 10 is formed by laminating a light-shielding film and a resist film on a glass substrate. The light-shielding film may be made of chromium.

An electron beam 49 emitted from the electron gun 41 illuminates the whole of the first aperture 43, which has a rectangular hole, through the dondenser lens 48 (CL). Here, the electron beam 49 is first formed in a rectangular shape. An electron beam in the form of a first aperture image, which has passed through the first aperture 43, is projected on the second aperture 44 by the projection lens 48 (PL). The position of the first aperture image on the second aperture 44 is controlled by the shaping deflector 46, so the beam shape and size of the first aperture image can be varied. An electron beam in the form of a second aperture image, which has passed through the second aperture 44, is focused by the objective lens 48 (OL), is deflected by the objective deflector 47, and illuminates a desired position on the mask substrate 10 on the XY stage 52.

The electron beam 49 emitted from the electron gun 41 is controlled by the blanking deflector 45 so that, in a beam-on state, the electron beam 49 passes through the blanking aperture 42 and that, in a beam-off state, the electron beam 49 is deflected so that the entire beam is shielded with the blanking aperture 42. An electron beam that has passed through the blanking aperture 42 from when the beam-on state had been entered from the beam-off state until the beam-off state was then entered is one electron beam shot. The amount of illumination in one shot of the electron beam that illuminates the resist film on the surface of the mask substrate 10 is adjusted according to the illumination time in each shot.

Each unit in the electronic beam drawing apparatus is controlled by a controller (not illustrated). For example, the controller controls the amount of deflection by the objective deflector 47 and the amount of the movement of the XY stage 52 to vary the position that the electron beam illuminates. The controller also controls the amount of deflection by the shaping deflector 46 to vary the shape and size of the beam. Accordingly, electron beams with the shape and size varied can illuminate the resist film on the mask substrate 10.

FIGS. 3A to 3C illustrate an example of a method of drawing an evaluation pattern. In evaluation pattern drawing, beams are used that have a shape obtained by dividing a line pattern in its longer-side direction (in the right-and-left direction on the drawing) into rectangles R with the same size and further dividing each rectangle R in its shorter-side direction (up-and-down direction on the drawing). These beams are linked to draw a line pattern as an evaluation pattern. By changing the number of divisions in the shorter-side direction to vary the beam shape, a line pattern is similarly drawn as an evaluation pattern. FIGS. 3A to 3C respectively illustrate examples in which the number of divisions is 3, 4, and 8.

As described above, an evaluation pattern constituted by a plurality of line patterns is drawn on the resist film on the mask substrate 10 by using beams with the size (width in the shorter-side direction) varied by changing the number of divisions (steps S101 to S103). When the evaluation pattern is drawn, the offset amount to be set in the electronic beam drawing apparatus is constant. This offset amount is an amount by which the beam size is changed to correct a beam size deviation due to, for example, a slight deviation in the electron beam column 40 and a control portion. When the offset amount is set to zero, beam size calculation processing in the electronic beam drawing apparatus becomes easy.

After drawing has been performed for all numbers of divisions (Yes in step S102), the resist film illuminated by electron beams is developed by using a known developing apparatus and developing solution (step S104). A portion of the resist film that has been illuminated by the electron beams becomes soluble in the developing solution, and a resist pattern is formed.

In step S105, the exposed light-shielding film is etched by using the resist pattern as a mask. Thus, the light-shielding film is processed, forming an evaluation pattern. After etching processing, the resist pattern is removed by ashing or the like.

In step S106, the dimension (line width) of the evaluation pattern is measured by using a measuring apparatus such as a CD-SEM. A difference between the evaluation pattern size and the design size is obtained for each number of divisions at the time of drawing. FIG. 4 is a graph illustrating an example of the line width change amount from a design value for each number of divisions.

In step S107, fitting is performed for the line width change amount from the design value for each number of divisions, the amount having been obtained in step S106, by using a model function Lm. The model function Lm is obtained by modeling the line width of a pattern based on a distribution of energy given by electron beams.

Figures 5A, 5B, 5C:
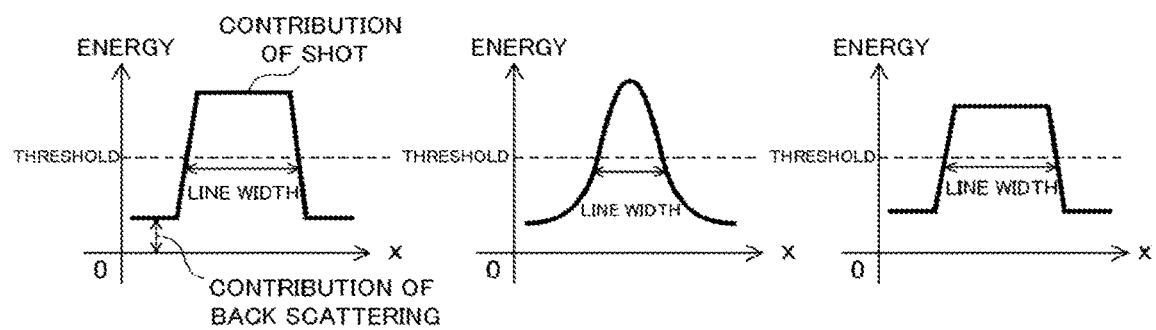
FIGS. 5A to 5C are each a graph illustrating a relationship between a distribution of energy given by electron beams and the line width of a pattern.

FIG. 5A is a graph illustrating a relationship between a distribution of energy given by electron beams and the line width of a pattern. An area in which energy is equal to or larger than a threshold corresponds to the line width. Model function Lm=f(n, a) is determined from this energy distribution; where n is the number of divisions and a is the offset amount. That is, the model function Lm is a function by which the line width of a pattern is calculated by defining the number of divisions and the offset amount.

The energy distribution varies depending on the type of resist material and the design size as illustrated in FIGS. 5A to 5C. Therefore, a plurality of model functions Lm based on the energy distribution are also prepared depending on the resist material and design dimension. The model function Lm used in step S107 is selected according to the type of the resist film formed on the mask substrate 10 and the design dimension of the evaluation pattern. In practice, the model function Lm has variables into which constants matching the design dimension and resist material (and process conditions) are input, and model function Lm=f(n, a) to be used in fitting is selected by entering these constants.

Figure 6:
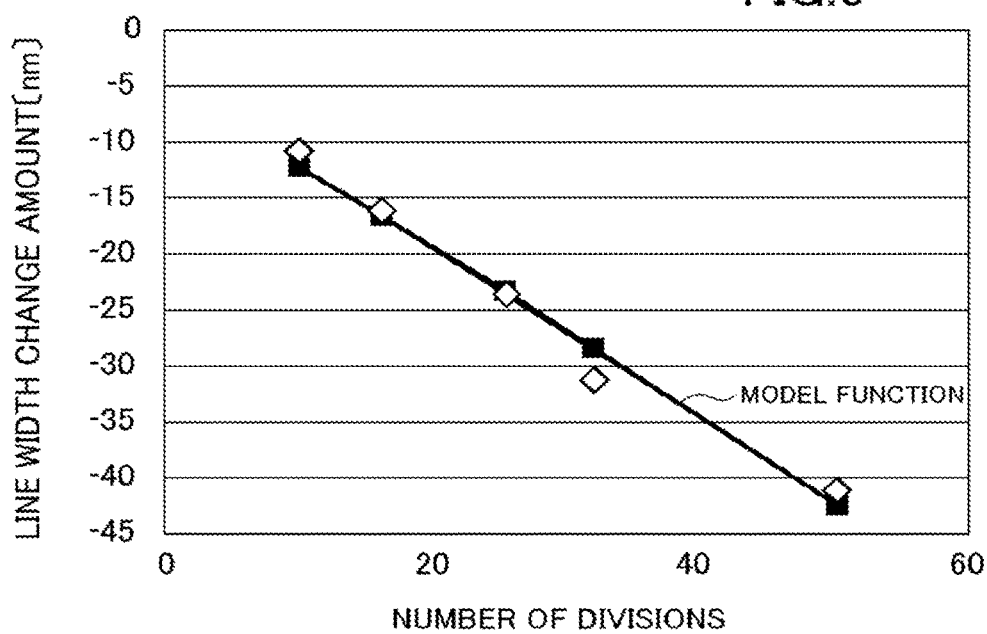
FIG. 6 is a graph illustrating an example in which the fitting of a model function to the amount of line width change from a design value for each number of divisions has been performed.

FIG. 6 is a graph illustrating an example in which the fitting of the model function Lm to the line width change amount from a design value for each number of divisions has been performed.

In step S108, the optimum offset amount a0 at which the model function Lm is brought closest to the line width change amount from the design value for each number of divisions is calculated by using the least squares method. Specifically, the offset amount a at which S in the equation below is minimized is the optimum offset amount a0.

$$S = \sum_{i=1}^{k} \{f(n_i, a) - d_i\}^2 \qquad \text{[Eq. 1]}$$

In the above equation, $n_1$ to $n_k$ are each the number of divisions and $d_1$ to $d_k$ are measurement results of the line width of the evaluation pattern when the numbers of divisions are $n_1$ to $n_k$.

At the optimum offset amount a0 obtained in this way, the line width of the drawing pattern scarcely changes even if the beam shape is varied by changing the number of divisions. Drawing precision can be improved by setting this optimum offset amount a0 in the electron beam drawing apparatus.

Comparative Example

Figure 7:
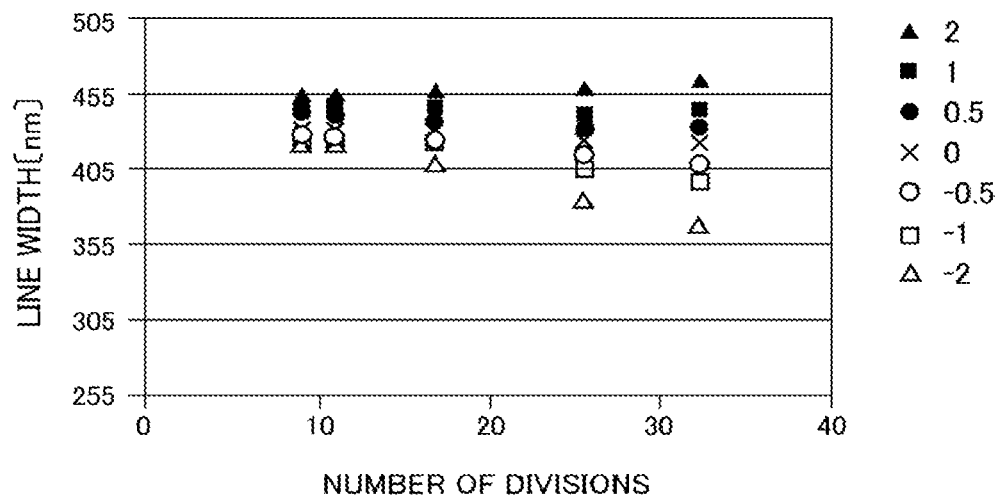
FIG. 7 is a graph illustrating the line width of an evaluation pattern in a comparative example.
Figure 8:
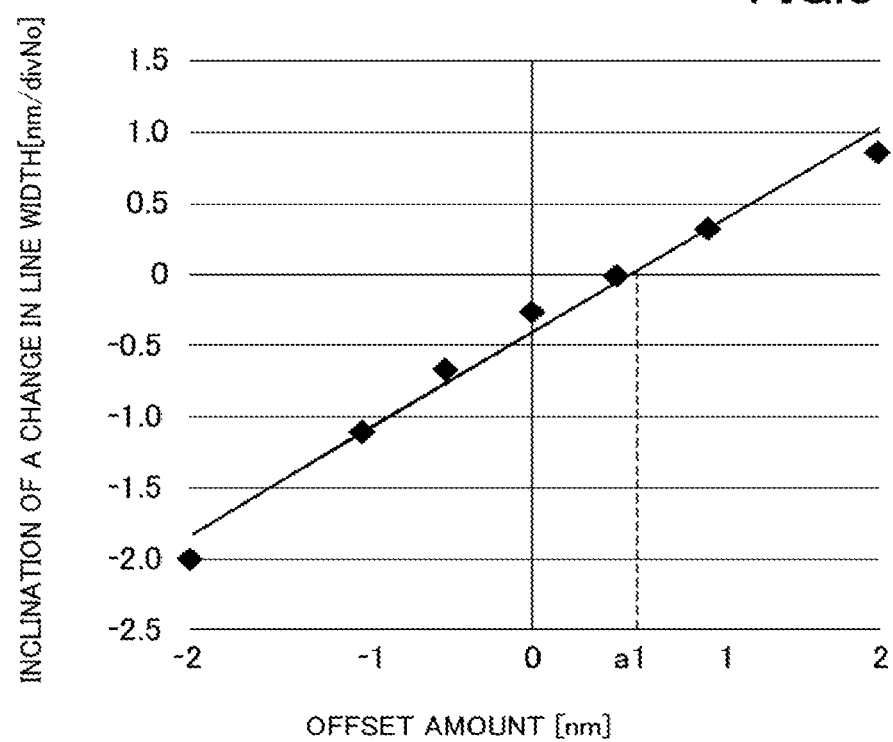
FIG. 8 is a graph illustrating the inclination of a change in the line width of the evaluation pattern in the comparative example.

A method of calculating the amount of offset in a comparative example will be described by using FIGS. 7 and 8. In this method, an evaluation pattern is drawn by varying the beam shape by changing the number of divisions as in the above embodiment and further changing the offset amount to be set in the drawing apparatus.

Next, development, etching, and the like are performed to form an evaluation pattern in the light-shielding film. Then, the size (line width) of the evaluation pattern is measured to obtain the size of the evaluation pattern for each number of divisions and each offset amount at the time of drawing. FIG. 7 is a graph illustrating an example of the line width for each number of divisions and each offset amount.

Next, the inclination of a change in line width with respect to the number of divisions is obtained for each offset amount. FIG. 8 is a graph illustrating an example of the inclination of a change in line width for each offset amount. The offset amount a1 at which the inclination of a change in line width becomes zero is obtained by linear approximation.

In this method, it is assumed that the amount of change in line width depending on the offset amount has a linear relationship with the number of divisions. However, the amount of change in line width depending on the offset amount and the number of divisions have a non-linear relationship, so there is a difference between the offset amount a1 illustrated in FIG. 8 and the actual optimum offset amount. In addition, in this method, drawing is performed by changing not only the number of divisions but also the amount of offset, so a time taken to draw the evaluation pattern is prolonged.

By contrast, according to this embodiment described above, the optimum offset amount a0 that can improve the drawing precision of the electron beam drawing apparatus can be obtained by performing the fitting of a model function to a drawing result, the model function being based on an energy distribution given by electron beams.

Furthermore, there is no need to change the offset amount, so a time taken to obtain the offset amount can be shortened when compared with the method in the comparative example.

Although, in the above embodiment, a structure in which electron beams are used has been descried, other charged particle beams such as ion beams may be used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of adjusting a charged particle beam drawing apparatus, by which an offset amount in beam size that is set in the charged particle beam drawing apparatus is obtained, the method comprising:
    forming a linear evaluation pattern on a substrate by changing number of divisions of a beam with a predetermined size and performing drawing by using divided beams;
    obtaining a change amount in a line width of the evaluation pattern from a design dimension for each number of divisions; and
    calculating the offset amount by fitting a model function to the change amount for each number of divisions, the model function being obtained by modeling a pattern line width based on a distribution of energy given by charged particle beams.

2. The method according to claim 1, wherein a plurality of model functions are prepared depending on a type of a resist on the substrate and the design dimension of the line width of the evaluation pattern, and the number of divisions and the offset amount are variables in the model functions.

3. The method according to claim 2, wherein:
    one model function is selected from the plurality of model functions according to the type of the resist on the substrate and the design dimension of the line width of the evaluation pattern formed on the substrate; and
    an offset amount at which the selected model function is brought closest to the change amount for each number of divisions is calculated.

4. The method according to claim 1, wherein an offset amount to be set in the charged particle beam drawing apparatus is made to be constant, and then the evaluation pattern is drawn.

5. The method according to claim 4, wherein when the evaluation pattern is drawn, the offset amount to be set in the charged particle beam drawing apparatus is made to be zero.

6. The method according to claim 1, wherein:
    the evaluation pattern includes a plurality of line patterns having the same width in a shorter-side direction; and
    a beam that draws each line pattern has a different width in the shorter-side direction.

7. A charged particle beam drawing method comprising:
    forming a linear evaluation pattern on a substrate by changing the number of divisions of a beam with a predetermined size in a charged particle beam drawing apparatus, and performing drawing by using divided beams;
    obtaining a change amount in a line width of the evaluation pattern from a design dimension for each number of divisions;
    calculating an offset amount in a beam size by fitting a model function to the change amount for each number of divisions, the model function being obtained by modeling a pattern line width based on a distribution of energy given by charged particle beams; and
    setting, in the charged particle beam drawing apparatus, the offset amount that has been calculated and drawing processing is performed.

8. The method according to claim 7, wherein an offset amount to be set in the charged particle beam drawing apparatus is made to be constant, and then the evaluation pattern is drawn.

9. The method according to claim 8, wherein when the evaluation pattern is drawn, the offset amount to be set in the charged particle beam drawing apparatus is made to be zero.

\* \* \* \* \*